United States Patent
Zakel et al.

(10) Patent No.: US 7,926,699 B2
(45) Date of Patent: Apr. 19, 2011

(54) METHOD AND DEVICE FOR TRANSFERRING A SOLDER DEPOSIT CONFIGURATION

(75) Inventors: Elke Zakel, Falkensee (DE); Ghassem Azdasht, Berlin (DE)

(73) Assignees: Pac Tech—Packaging Technologies GmbH (DE); Smart Pac GmbH Technology Services (DE)

( * ) Notice: Subject to any disclaimer, the term of this patent is extended or adjusted under 35 U.S.C. 154(b) by 0 days.

(21) Appl. No.: 12/566,098

(22) Filed: Sep. 24, 2009

(65) Prior Publication Data

US 2010/0051673 A1 Mar. 4, 2010

Related U.S. Application Data

(62) Division of application No. 11/666,188, filed as application No. PCT/DE2005/001698 on Sep. 26, 2005, now Pat. No. 7,762,446.

(30) Foreign Application Priority Data

Oct. 25, 2004 (DE) .............................. 2004 051 983

(51) Int. Cl.
*B23K 31/02* (2006.01)
(52) U.S. Cl. ........................................ 228/245; 228/246
(58) Field of Classification Search .................. None
See application file for complete search history.

(56) References Cited

U.S. PATENT DOCUMENTS

| 5,205,896 A | 4/1993 | Brown et al. |
| 2003/0111508 A1 | 6/2003 | Cobbley et al. |

FOREIGN PATENT DOCUMENTS

| EP | 0 673 188 | 9/1995 |
| JP | 08153961 | 6/1996 |
| JP | 2002-093836 A | * 3/2002 |

OTHER PUBLICATIONS

Translation of JP-2002-093836A.*
International Search Report corresponding to PCT/DE2005/001698, under date of mailing of Dec. 16, 2005.

* cited by examiner

*Primary Examiner* — Kiley Stoner
(74) *Attorney, Agent, or Firm* — Quarles & Brady LLP

(57) ABSTRACT

Method and device for transferring a solder deposit configuration having multiple solder deposits onto a terminal surface configuration of a contact surface of a substrate (36) using a removal of multiple solder deposits from a solder deposit reservoir (25) accommodated in a solder deposit receptacle unit (11) via an isolation unit (12), which is implemented like a template and is situated above the solder deposit reservoir, to implement the solder deposit configuration implemented corresponding to the terminal surface configuration, and using a subsequent transfer of the solder deposit configuration onto the terminal surface configuration of the substrate, the solder deposit reservoir being impinged by partial vacuum through template openings (15) of the isolation unit to transfer the solder deposits from the solder deposit reservoir into the isolation unit, the solder deposit reservoir (25) being ventilated via a floor wall (20) situated diametrically opposite the isolation unit during the partial vacuum impingement (27) by the isolation unit (12).

7 Claims, 6 Drawing Sheets

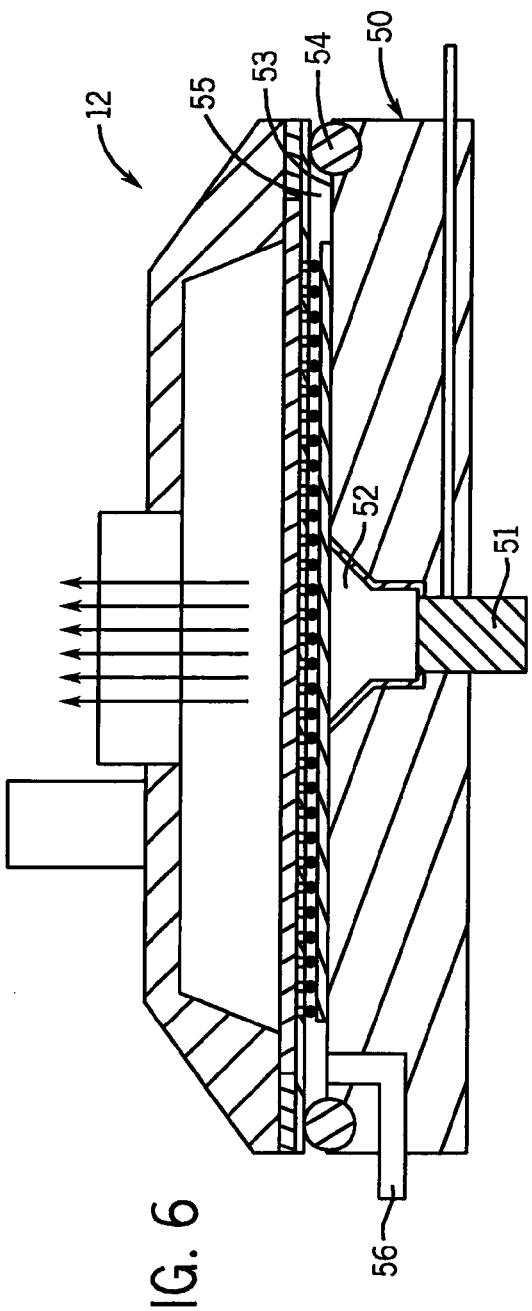
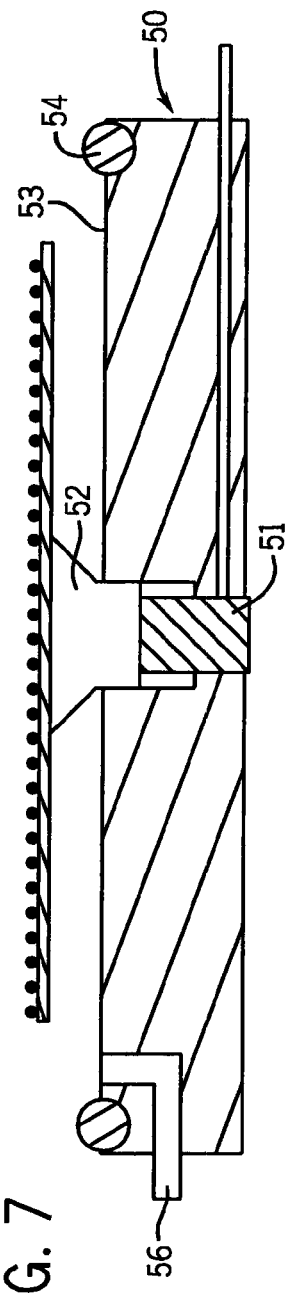
FIG. 6
FIG. 7

METHOD AND DEVICE FOR
TRANSFERRING A SOLDER DEPOSIT
CONFIGURATION

CROSS-REFERENCE TO RELATED PATENT
APPLICATIONS

This is a divisional application of U.S. patent application Ser. No. 11/666,188, Mar. 11, 2008, now U.S. Pat. No. 7,762,446 which represents the national stage entry under 35 U.S.C. §371(c) of PCT Application No. PCT/DE05/01698, filed on Sep. 26, 2005, which claims priority to German Patent Application No. 2004-051-983.8 filed on Oct. 25, 2004. The full contents of these applications are incorporated by reference herein as is set forth in their entirety.

STATEMENT REGARDING FEDERALLY
SPONSORED RESEARCH

Not applicable.

BACKGROUND OF THE INVENTION

The present invention relates to a method for transferring a solder deposit configuration having multiple solder deposits on a terminal surface configuration of a contact surface of a substrate using a removal of multiple solder deposits from a solder deposit reservoir accommodated in a solder deposit receptacle unit via an isolation unit, which is implemented like a template and is situated above the solder deposit reservoir, to form a solder deposit configuration implemented according to the terminal surface configuration, and using a subsequent transfer of the solder deposit configuration to the terminal surface configuration of the substrate, the solder deposit reservoir being impinged by partial vacuum through template openings of the isolation unit to transfer the solder deposits from the solder deposit reservoir into the isolation unit. Furthermore, the present invention relates to a device especially suitable for performing the method.

In a method used until now for transferring a solder deposit configuration, the isolation unit connected to a partial vacuum unit is moved into the solder deposit receptacle unit to remove a number of isolated solder deposits corresponding to the template openings in such a way that air enters, as a result of the partial vacuum impingement of the isolation unit, into the solder deposit receptacle unit via a frame gap implemented between the circumference of the isolation unit and a delimitation wall of the solder deposit receptacle unit. A corresponding peripheral air inflow into the solder deposit reservoir accommodated in the solder deposit receptacle unit results therefrom, with the result that an agglomeration of solder deposits occurs in the center of the radial air inflow. Because of this central solder deposit accumulation, depending on the planar extension of the isolation unit, there may be no solder deposits or solder deposits in an inadequate number diametrically opposite the decentralized areas of the isolation unit, so that due to the partial vacuum impingement of the isolation unit, not all template openings are occupied by solder deposits.

SUMMARY OF THE INVENTION

The object of the present invention is therefore to refine the method and a device used for performing the method so that the occurrence of flaws described above during the occupation of the template openings of the isolation unit is avoided as much as possible.

This object is achieved by a method having the features of Claim 1.

In the method according to the present invention, the solder deposit reservoir is ventilated during the partial vacuum impingement by the isolation unit via a floor wall situated diametrically opposite the isolation unit.

Due to the ventilation of the solder deposit reservoir from a side diametrically opposite the plane of the isolation unit, as a result of the partial vacuum impingement of the isolation unit, a uniformly planar inflow of air into the solder deposit reservoir may occur. An occurrence of a radial air inflow into the solder deposit reservoir with the disadvantageous central accumulation of the solder deposits is avoided. Instead, due to the planar inflow of air from the bottom, which thus occurs essentially coaxially to the partial vacuum impingement of the isolation unit, the relative configuration of the solder deposits in the solder deposit reservoir is not disadvantageously influenced. Therefore, a distribution of the solder deposits in the solder deposit reservoir which is plane-parallel to the isolation unit before the partial vacuum impingement of the isolation unit is essentially maintained during the partial vacuum impingement. Therefore, solder deposits are always provided in a sufficient number also diametrically opposite the external, decentralized areas of the isolation unit, so that the formation of the flaws described above, i.e., template openings of the isolation unit which are unoccupied or incorrectly occupied, may not occur.

To achieve complete occupation of the template openings of the isolation unit in particular even when a relatively low partial vacuum is applied, it may be advantageous to perform the ventilation of the floor wall in partial areas of the floor wall in such a way that different partial areas of the floor wall are ventilated sequentially beginning with a first partial area. It is thus ensured that the vacuum forces acting on the individual solder deposits are sufficiently large even in the event of a relatively low partial vacuum to move the solder deposits into the template openings.

One possibility for the successive ventilation of partial areas of the floor wall comprises performing the ventilation using an air introduction unit movable along the floor wall.

It may prove advantageous for influencing the distribution of the solder deposits in the solder deposit reservoir to perform the ventilation using elevated pressure. In particular to prevent disadvantageous impairment of the vacuum effect acting on the solder deposits because of this, it may be advantageous to perform the ventilation at elevated pressure with a time offset to the partial vacuum impingement of the isolation unit, i.e., for example, to perform the elevated pressure impingement of the solder deposit reservoir during a phase in which there is no vacuum impingement of the isolation unit.

In a preferred variation of the method, the isolation unit is additionally impinged by oscillations during the partial vacuum impingement, to thus mechanically support the positioning of the individual solder deposits in the template openings of the isolation unit. For this purpose, an oscillation impingement of the isolation unit coaxial to the direction of the partial vacuum impingement has been shown to be especially effective.

The device according to the present invention for transferring a solder deposit configuration has a solder deposit receptacle unit, which is provided with an at least partially air-permeable floor wall for situating the solder deposit reservoir.

In an advantageous embodiment of the device, the floor wall is provided with an air introduction unit, whose position to the floor wall is changeable, to introduce air into the solder deposit receptacle unit.

It may prove to be especially advantageous for influencing the distribution of the solder deposits in the solder deposit reservoir if the air introduction unit has a connection unit for connecting a compressed air source.

In a preferred embodiment of the device, the isolation unit is provided with a vibration oscillator, which allows the isolation unit to be impinged by mechanical oscillations. The vibration oscillator may be implemented as an ultrasonic generator, for example.

BRIEF DESCRIPTION OF THE DRAWINGS

In the following, preferred variations of the method and embodiments of devices especially suitable for performing the method are explained in greater detail on the basis of the drawing.

FIG. 6 shows a variation of the transfer of the solder deposit configuration received by the isolation device;

FIG. 7 shows the contact substrate having the solder deposit configuration situated thereon after completed transfer.

DETAILED DESCRIPTION OF THE INVENTION

Figure 1:
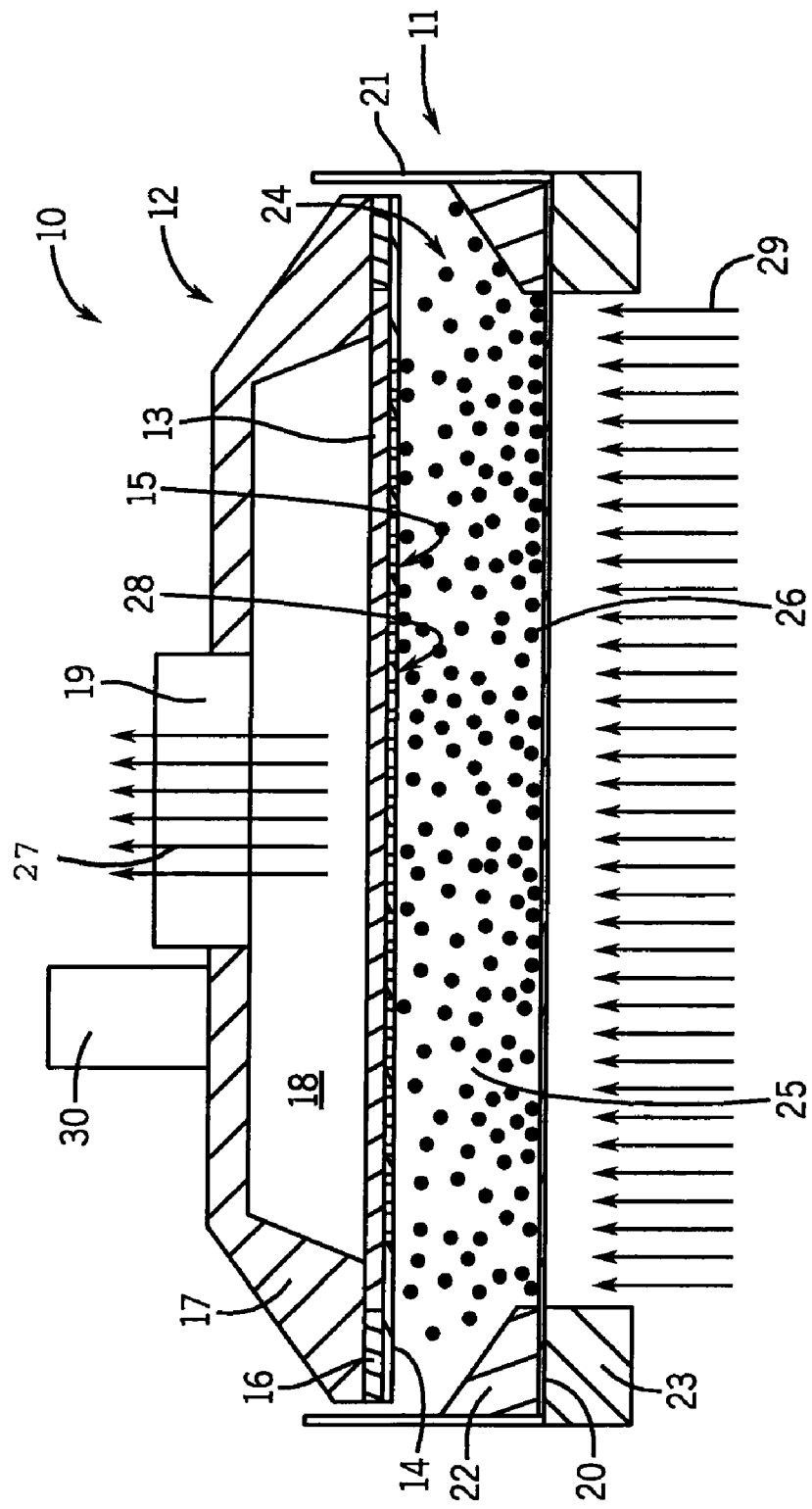
FIG. 1 shows a first variation of the method with illustration of a first embodiment of the device.

FIG. 1 shows a transfer device 10 having an isolation unit 12 situated above a solder deposit receptacle unit 11. The isolation unit 12 has a carrier plate 13, implemented as air-permeable and rigid, which is provided on its side facing toward the solder deposit receptacle unit 11 with an isolation template 14. The isolation template 14 is provided with multiple template openings 15, which are implemented as through openings and are distributed in a defined planar configuration over the carrier plate, in particular as a perforation matrix 28, perpendicular to the plane of the drawing. The isolation template 14 is connected via a fastener 16, which is implemented as annular or frame-like, to a housing part 17, which, together with the carrier plate 13, defines a housing chamber 18, which is provided with a connection unit 19 for connection to a vacuum pump (not shown in greater detail here). As may also be seen from FIG. 1, the housing part 17 of the isolation unit 12 is equipped with an ultrasonic generator 20, which causes the isolation unit 14 to oscillate during operation.

The solder deposit receptacle unit 11 has a floor wall 20, implemented as air-permeable, and a side wall 21, implemented in the present case as a hollow cylinder, so that the solder deposit receptacle unit 11 is implemented in the present case as essentially cup-like. In the exemplary embodiment shown, the floor wall 20 is accommodated between two fasteners 22, 23, implemented as annular or frame-like, to accommodate the floor wall 20 and/or to connect the floor wall 20 to the side wall 21.

As may also be seen from FIG. 1, a solder deposit reservoir 25 comprising multiple solder deposits 26, which are implemented in the present case as spherical solder material, is located in a receptacle space 24 of the solder deposit receptacle unit 11 defined by the floor wall 20 and the side wall 21.

FIG. 1 shows the transfer device 10 during a first phase for receiving the solder deposits 26 accommodated unordered in the solder deposit receptacle unit 11 using the isolation unit 12. For this purpose, a vacuum is applied to the isolation unit 12 situated in the removal position above the solder deposit receptacle unit 11 via the connection unit 19, so that the partial vacuum current 27 indicated in FIG. 1 results due to the partial vacuum. Due to the partial vacuum current 27, the individual solder deposits 26, which were located in unordered distribution on the floor wall 20 before application of the partial vacuum current 27, are moved toward the isolation template 14 of the isolation unit 12 as shown by the illustration in FIG. 1. In the exemplary embodiment illustrated in FIG. 1, the floor wall 20 is implemented as porous over its entire surface covered by the perforation matrix 28 of the isolation template 14, for example, as a perforated plate. Induced by the partial vacuum current 27, an essentially uniformly distributed ventilation flow 29 results over the surface of the floor wall 20, with the result that a corresponding movement activity of the solder deposits 26 distributed uniformly over the surface of the floor wall 20 occurs. The solder deposits 26 are moved toward the isolation template 14 and upon positioning against the template openings 15, which have a smaller diameter than the solder deposits 26, are held on the isolation template 14 as a result of the partial vacuum. The implementation of relative positioning of the solder deposits 26 diametrically opposite the template openings 15 may be supported by an oscillation impingement of the isolation unit 12 via the activation of the ultrasonic generator 30 situated on the housing part 17.

Figure 2:
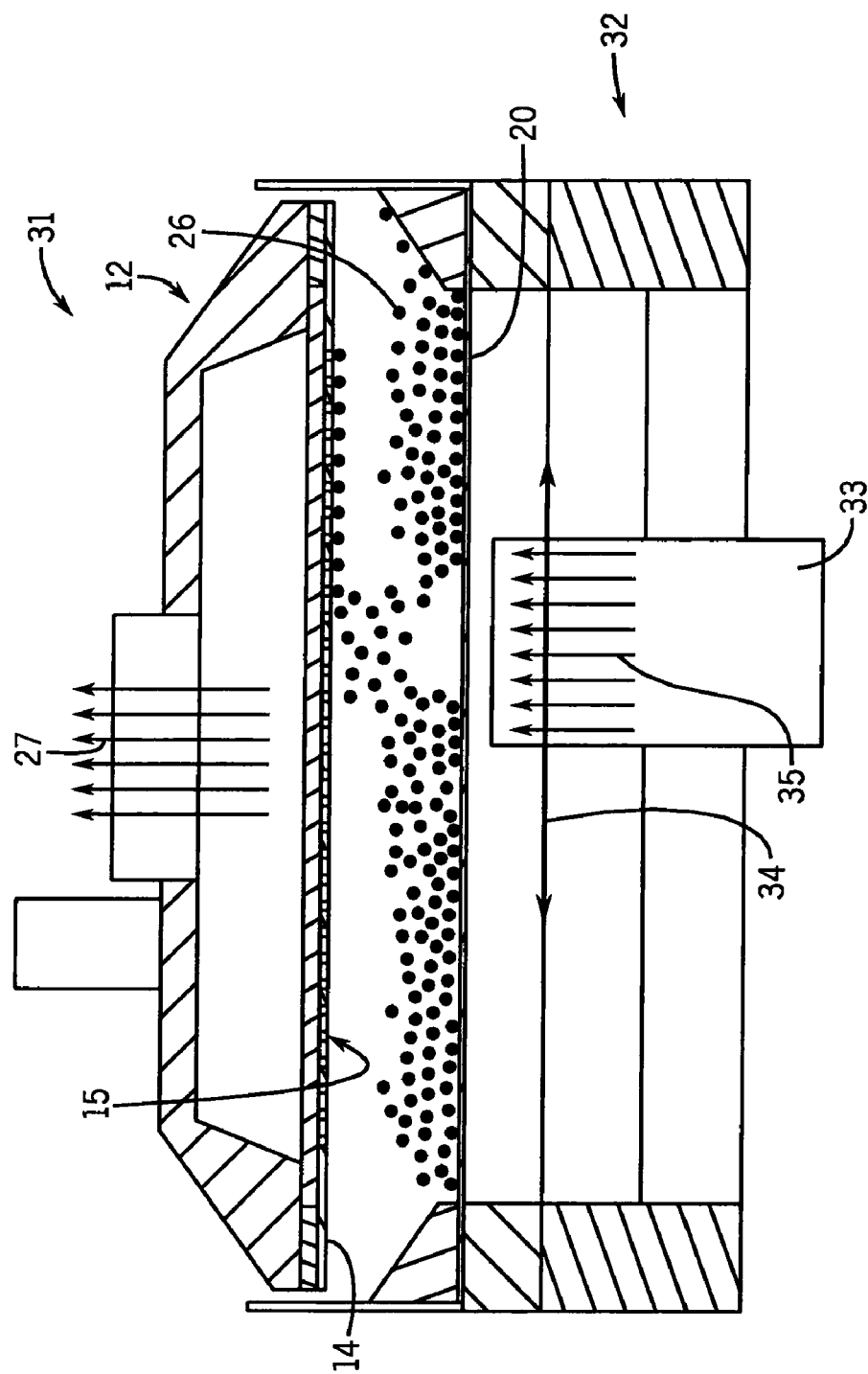
FIG. 2 shows a second variation of the method with illustration of a second embodiment of the device.

FIG. 2 shows a transfer device 31 in an embodiment varied in relation to the illustration in FIG. 1, which, in contrast to the transfer device 10, has a solder deposit receptacle unit 32 which is provided with an air introduction unit 33 situated on the ventilation side of the floor wall 20. As indicated by the double arrow 34 in FIG. 2, the air introduction device 33 is movable in a plane parallel to the floor wall 20. Depending on the implementation of the air introduction device 33 and/or the planar shape of the floor wall 20 and/or the isolation template 14, to whose planar shape the planar shape of the floor wall 20 is tailored, the travel motion of the air introduction device 33 may be implemented moving back and forth translationally or also as a dual-axis movement. Thus, for example, if the floor wall 20 is formed in the shape of a circular disk, it is advantageous to apply the travel movement of the air introduction device 33 in a spiral shape, to impinge the entire surface of the floor wall 20 using a ventilation flow 35 starting from the periphery or the center of the floor wall 20. It is clear from the illustration in FIG. 2 that due to the regional impingement of the floor wall 20 with the ventilation flow induced by the partial vacuum current 27, the template openings 15 of the isolation template 14 are occupied by solder deposits 26 in accordance with the ventilated areas.

Figure 3:
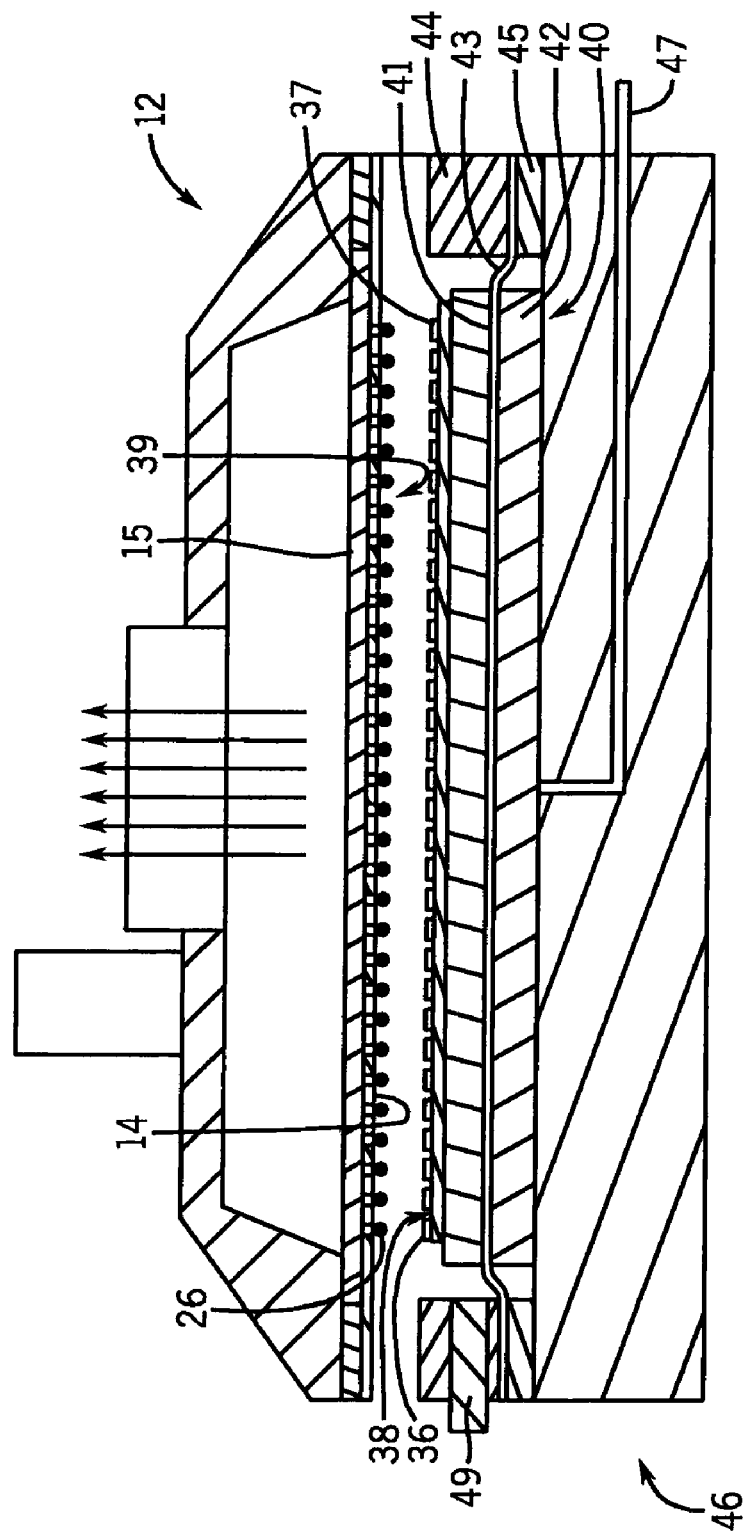
FIG. 3 shows an isolation unit of the device directly before the transfer of a solder deposit configuration to a contact substrate.

FIG. 3 shows the isolation unit 12 having the template openings 15 of the isolation template 14 occupied by solder deposits 26 during the arrangement above a contact substrate 36, which may be implemented as a wafer, for example, and has multiple contact surfaces 37. The contact surfaces 37 of the contact substrate 36 have a contact surface configuration 38, which corresponds to a solder deposit configuration 39 defined by the perforation matrix 28 of the isolation template 14. To maintain the solder deposit configuration 39, the partial vacuum impingement to implement the partial vacuum current 27 is maintained even after completed removal of the solder deposits 26 from the solder deposit receptacle unit.

Therefore, the isolation unit 12 may also be used as a handling unit for transportation of the solder deposits 26 removed from the solder deposit receptacle unit 32 and relative orientation of the solder deposit configuration 39 to achieve the superposition with the contact surface configuration 38 shown in FIG. 3. The axial control for the relative orientation of the solder deposit configuration 39 to the contact surface configuration 38 may be supported in a known way by an image processing unit (not shown in greater detail here).

As FIG. 3 also shows, the contact substrate 36 is situated on a receptacle unit 40 having a receptacle plate 41 and a counter plate 42, which accommodate a flexible seal membrane 43 between them. The seal membrane 43 is accommodated peripherally between two housing rings 44, 45. In the configuration shown in FIG. 3, the receptacle unit 40 is situated on a bonding table 46, which is provided with a partial vacuum line 47 for the temporarily fixed positioning of the receptacle unit 40 and/or the contact substrate 36 during the orientation procedure for the relative positioning of the solder deposit configuration 39 in relation to the contact surface configuration 38.

After completed relative positioning, the isolation unit 12 having the isolation template 14 is moved toward the housing ring 44 of the receptacle unit 40, so that a terminated contact space 48 (FIG. 4) is formed between the receptacle unit 40 and the isolation unit 12. To generate the contact pressure necessary for a bonding procedure, a vacuum is generated in the contact space 48 via a vacuum connection unit 49 implemented in the housing ring 44 here after the vacuum impingement of the receptacle unit 40 by the partial vacuum line 47 is ended. Subsequently, the contact substrate 36 is heated via the receptacle unit 40 to produce a thermal bond between the solder deposits 26 and the contact surfaces 37 of the contact substrate 36 in a reflow method.

The vacuum generated in the contact space 48 allows the build-up of the contact pressure necessary for the contacting, without pressure forces having to be applied externally to the device. Therefore, the necessity of dimensioning the device appropriately is also dispensed with. Furthermore, after prior relative positioning of the solder deposit configuration 39 in relation to the contact surface configuration 38 during the partial vacuum impingement of the contact space 48, no separate guide units are necessary to fix the exact relative positioning in the contact pressure phase. Because of the flexibility of the seal membrane 43, parallelism deviations between the surfaces of the isolation template 14 and the contact substrate 36 facing toward one another, which may be present before the partial vacuum impingement, are compensated for, so that co-planarity of the surfaces and thus a contact gap width which is as constant as possible may be ensured in the contact pressure phase. The partial vacuum impingement of the contact space 48 particularly ensures that the relative positioning is maintained during the reflow. A flux application present between the solder deposits 26 and the contact surfaces 37 is displaced due to the contact pressure, so that direct contact between the solder deposits 26 and the contact surfaces results immediately at the beginning of the reflow phase.

Figure 5:
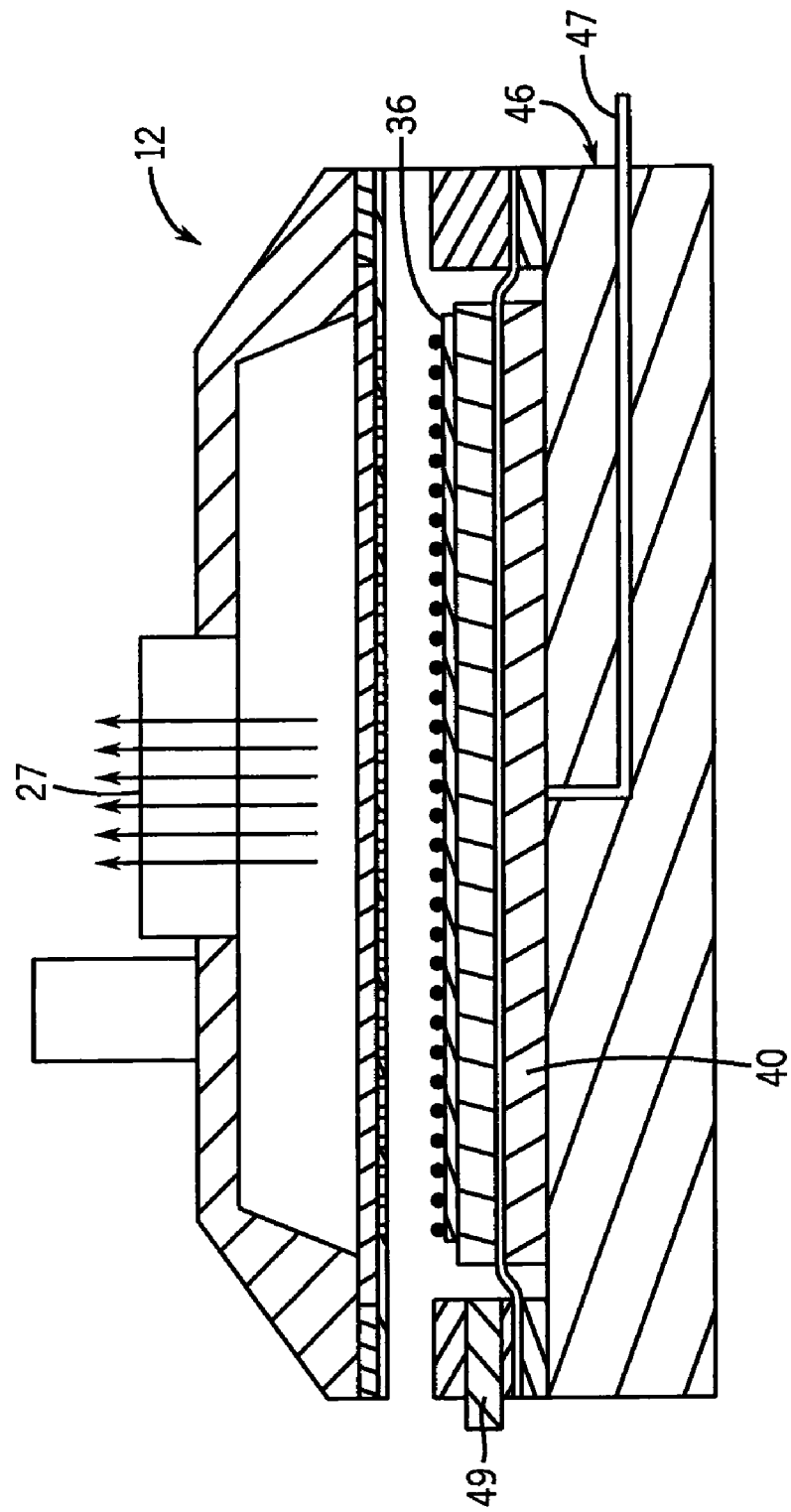
FIG. 5 shows the contact substrate having the solder deposit configuration situated thereon after completed transfer.

By turning off the vacuum applied via the vacuum connection unit 49, the receptacle unit 40 is transferred to the bonding table 46 again after completed contacting, as shown in FIG. 5.

Figure 4:
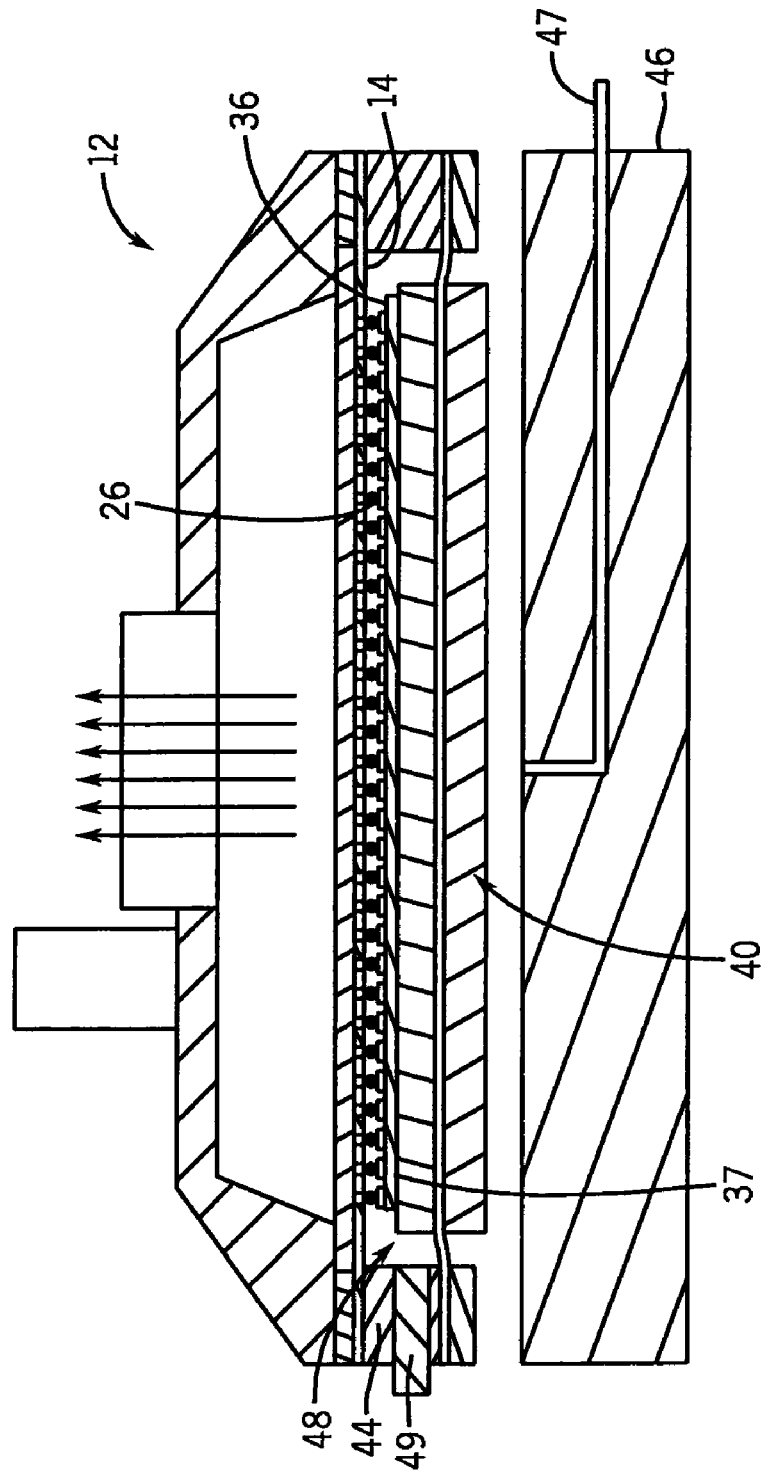
FIG. 4 shows the transfer of the solder deposit configuration to a contact surface configuration of the contact substrate.

As an alternative to the procedure described with reference to FIGS. 3, 4, and 5, in which a flexible seal membrane 43 is used for the transfer of the solder deposit configuration 39 situated on the isolation template 14 of the isolation unit 12 to the contact surface configuration 38 of the contact substrate and/or to generate the contact pressure necessary to perform the bonding procedure, a bonding table 50 shown in FIGS. 6 and 7 has a lift unit 51, having a lift table 52 extendable from the plane of the bonding table 50. A seal to generate a gas-tight contact space 55 (FIG. 6) between the isolation unit 12 and the bonding table 50 is made possible by an elastic seal 54 situated in a table surface 53 peripherally to the contact substrate 36, which may be implemented as an O-ring seal, for example. The flexibility of the seal 54 allows, in cooperation with the partial vacuum impingement of the contact space 55, the effects already described in detail with reference to FIG. 4. The impingement of the contact space 55 using partial vacuum is performed via a partial vacuum line 56 implemented in the bonding table 50.

What is claimed is:

1. A method for transferring multiple solder deposits to a terminal surface configuration of a contact surface of a substrate, the method comprising:
   placing an isolation unit on a solder deposit receptacle unit, wherein the isolation unit includes a template with template openings that correspond to a solder deposit configuration and wherein the solder deposit receptacle unit includes a solder deposit reservoir with an air-permeable floor wall and an air suction unit whose positioning relative to the air-permeable floor wall is changeable;
   transferring multiple solder deposits from the solder deposit reservoir to the template openings of the isolation unit by a partial vacuum impingement of the solder deposit reservoir through the template openings and moving the air suction unit to regionally suck air through the air-permeable floor wall; and
   transferring the solder deposit configuration on the isolation unit to the substrate to establish the terminal surface configuration thereon.

2. The method according to claim 1, wherein sucking air through the air-permeable floor wall is performed in partial areas of the air-permeable floor wall in such a way that different areas of the air-permeable floor wall are ventilated in chronological sequence, beginning with a first partial area.

3. The method according to claim 1, further comprising the step of ventilating the solder deposit reservoir using elevated pressure during a phase in which there is no partial vacuum impingement.

4. The method according to claim 3, wherein the ventilation using elevated pressure is performed with a time offset to the partial vacuum impingement of the isolation unit.

5. The method according to claim 1, wherein the isolation unit is additionally impinged by oscillations during the partial vacuum impingement.

6. The method according to claim 5, wherein the oscillation impingement of the isolation unit is performed coaxially to the direction of the partial vacuum impingement.

7. The method according to claim 1, wherein the isolation unit further includes a vacuum connection unit for connect to a vacuum unit for creation of a partial vacuum in the isolation unit.

* * * * *